US006160081A

United States Patent [19]

Tanaka et al.

[11] Patent Number: 6,160,081

[45] Date of Patent: Dec. 12, 2000

[54] PHOTOSENSITIVE POLYIMIDE RESIN COMPOSITION

[75] Inventors: Akira Tanaka; Kei Sakamoto; Kenichi Ito; Yasuhiro Yoneda; Kishio Yokouchi; Yasuo Naganuma, all of Kawasaki, Japan

[73] Assignees: Nippon Zeon Co., Ltd., Tokyo, Japan; Fujitsu Limited, Kanagawa, Japan

[21] Appl. No.: 09/183,124

[22] Filed: Oct. 30, 1998

[30] Foreign Application Priority Data

Oct. 31, 1997 [JP] Japan .................................... 9-316138

[51] Int. Cl.$^7$ ............................ C08G 73/10; C08G 69/26

[52] U.S. Cl. .......................... 528/170; 528/125; 528/126; 528/128; 528/172; 528/173; 528/179; 528/188; 528/220; 528/229; 528/350; 528/353; 528/171; 528/174; 524/600; 524/607; 430/270; 430/283

[58] Field of Search .................................... 528/353, 125, 528/126, 171, 128, 172, 174, 173, 179, 188, 220, 229, 350; 524/600, 607; 430/270, 283

[56] References Cited

U.S. PATENT DOCUMENTS

| | | | |
|---|---|---|---|
| Re. 30,186 | 1/1980 | Rubner et al. | 96/35.1 |
| 3,957,512 | 5/1976 | Kleeberg et al. | 96/35.1 |
| 4,040,831 | 8/1977 | Rubner et al. | 96/35.1 |
| 4,243,743 | 1/1981 | Hiramoto et al. | 430/281 |
| 5,238,784 | 8/1993 | Tokoh et al. | 430/283 |
| 5,777,068 | 7/1998 | Tanaka et al. | 528/353 |

FOREIGN PATENT DOCUMENTS

| | | |
|---|---|---|
| 0502400 | 9/1992 | European Pat. Off. . |
| 55-30207 | 8/1980 | Japan . |
| 55-41422 | 10/1980 | Japan . |
| 59-52822 | 12/1984 | Japan . |
| 63-183439 | 7/1988 | Japan . |
| 1-259351 | 10/1989 | Japan . |
| 4-70661 | 3/1992 | Japan . |
| 4-77741 | 3/1992 | Japan . |
| 4-363361 | 12/1992 | Japan . |
| 5-5995 | 1/1993 | Japan . |
| 5-100424 | 4/1993 | Japan . |
| 5-281717 | 10/1993 | Japan . |
| 8-82931 | 3/1996 | Japan . |
| 8-95247 | 4/1996 | Japan . |

OTHER PUBLICATIONS

Kubota et al. *J. Macromol. Sci.–Chem.*, A24(12):1407–1422 (1987) the month in the date of publication is not available.

*Primary Examiner*—P. Hampton-Hightower
*Attorney, Agent, or Firm*—Dinsmore & Shohl LLP

[57] ABSTRACT

The invention relates to a photosensitive polyimide resin composition comprising (A) a polyamic acid having, in its main chain, repeating units formed from a polycondensation product of at least one tetracarboxylic acid or tetracarboxylic anhydride thereof with at least one diamine compound, and having actinic ray-sensitive functional groups at both terminals thereof; (B) a photosensitive auxiliary having a photopolymerizable functional group; (C) a photopolymerization initiator; and (D) a solvent, wherein ① the polyamic acid is such that when the repeating unit represented by the formula (1) is defined as a unit molecular weight, a unit molecular weight per carboxyl group (unit molecular weight/COOH) falls within a range of from 200 to 300, and ② the photosensitive resin composition permits the formation of a polyimide film having a residual stress of 40 MPa or lower and a coefficient of thermal expansion of 30 ppm/° C. or lower on a substrate, and to said polyamic acid, a polyimide film having excellent film properties, and a pattern forming process using the photosensitive polyimide resin composition.

20 Claims, No Drawings

PHOTOSENSITIVE POLYIMIDE RESIN COMPOSITION

FIELD OF THE INVENTION

The present invention relates to photosensitive polyimide resin composition, which permit the formation of a polyimide film low in residual stress and coefficient of thermal expansion on a substrate such as a silicon wafer, and development with an alkaline aqueous solution. The present invention also relates to polyamic acids, pattern forming processes and polyimide films.

BACKGROUND OF THE INVENTION

In a fabrication process of a semiconductor device, a photoresist is generally separated and removed from a substrate after its role has been filled in a step of etching or the like. However, such a photoresist film remains unremoved as a permanent film when it is used as a surface-protecting film or a layer insulation film. Therefore, it is required to have electrically and mechanically high characteristics or properties. Further, such a film also must resist a high temperature applied in the fabrication process of the semiconductor device.

In recent years, a film formed of a photosensitive polyimide resin has been used in such an application. The polyimide resin is excellent in electrical and mechanical characteristics, and heat resistance and is used as a surface-protecting film or layer insulation film for a semiconductor device, or the like. In order to selectively provide a film of a polyimide resin on minute parts of the semiconductor device, it is convenient to use a photosensitive polyimide resin.

In recent years, various proposals as to photosensitive polyimide resins the solubility of which varies upon exposure to light have been made. Typical examples of such a photosensitive polyimide resin include compounds with a photopolymerizable acryloyl group introduced into a polyamic acid which is a precursor of a polyimic resin (Japanese Patent Publication Nos. 30207/1980 and 41422/1980.). A precursor of polyimide, in which an acryloyl group has been introduced in the form of a salt, has also be proposed (Japanese Patent Publication No. 52822/1984). In the photosensitive polyimide resin making use of such a polyimide precursor, a film of the photosensitive polyimide resin is formed on a semiconductor device, the film is subjected to patterning exposure to form a pattern, and the polyamic acid is then cyclized by a heat treatment, thereby polyimidating it. At this time, the moiety of the photosensitive group is eliminated and volatilized, thereby reducing the final thickness of the film formed.

The use of the photosensitive polyimide resin permits marked shortening of a pattern-forming process. However, the conventional photosensitive polyimide resins have involved problems such as (1) the synthesizing route is complicated, (2) the photosensitive group is not fully eliminated by polyimidation, and (3) they are insufficient in storage stability and sensitivity to light, and additionally had drawbacks such as (4) a polyimide film formed has a high residual stress, (5) the polyimide film has a high coefficient of thermal expansion, and (6) they are difficult to develop with an alkaline aqueous solution.

The coefficients of thermal expansion of metal wires and various substrates are generally lower than those of resins. When a polyimide film is formed on a substrate, and at this time a difference in coefficient of thermal expansion between the substrate and the polyimide film is great, problems such as cracking, breaking of wire and warpage or curling of the substrate are caused by heating or generation of heat in a production process of a part or upon the use of the part. When the residual stress of the polyimide film is high, similar problems are easy to occur. On the other hand, the development with an organic solvent has involved such problems that developer cost is high, explosion-proof apparatus are required, and human health may be endangered.

There have recently been proposed photosensitive resin compositions comprising an actinic ray-sensitive functional group (Japanese Patent Application Laid-Open Nos. 70661/1992 and 77741/1992). The photosensitive resin compositions disclosed in these publications are prepared by a special process in which a polyamic acid having carbon—carbon double bonds at its terminals is reacted in a solvent composed of an amide compound having a polymerizable carbon—carbon double bond, and are characterized in that the polyamic acid itself is photosensitive and the solvent itself is completely photosensitive. However, the polyamic acids disclosed in these publications are easy to eliminate their modified terminal groups and poor in stability. In these photosensitive resin compositions, the solvent also functions as a photosensitive auxiliary. Therefore, such a composition has involved a problem that when the composition is applied to a substrate and subjected to a heat treatment to form a polyimide film, a residual stress of the polyimide film against the substrate increases to a great extent.

On the other hand, the photosensitive polyimide resin compositions have involved a problem that they are difficult to develop with an alkaline developer or alkaline aqueous solution. For example, the negative type photosensitive polyimide resins disclosed in the above-described Japanese Patent Publication Nos. 30207/1980 and 41422/1980, etc., and those obtained by introducing a photopolymerizable group through an ionic bond into a precursor of polyimide disclosed in Japanese Patent Publication No. 52822/1984 and the like all use organic solvents as their developers. Therefore, such photosensitive polyimide resins have involved such problems that developer cost is high, explosion-proof apparatus are required, and human health may be endangered.

Polyimide precursors heretofore reported as the alkali-developed or alkaline aqueous solution-developed type include, for example, those obtained by introducing a protective group capable of leaving into a carboxyl group or a phenolic hydroxyl group under acid or alkaline conditions [J. Macromol. Sci. Chem., A24(12), pages 1407–1422 (1987), Japanese Patent Application Laid-Open No. 259351/1989 and Japanese Patent Application Laid-Open No. 363361/1992]. However, these precursors require to introduce a substituent group great in steric hindrance through a covalent bond into a main-chain carboxyl group or side-chain hydroxyl group. Therefore, they involve such problems that their synthetic processes become complicated, they require a high curing temperature, and film properties of films formed therefrom are deteriorated.

It has been proposed to incorporate a dihydropyridine derivative, which is a photo-induced base generator, and accelerate the imidation-facilitating effect of a base formed by exposure by a PEB (post-exposure baking), thereby developing a difference in solubility caused by the imidation with an alkaline developer (Japanese Patent Application Laid-Open Nos. 5995/1993 and 281717/1993). However, these processes involves such problems that the PEB treatment must be used, and the film formed has a low sensitivity to exposure, and so an exposure value must be made greater.

It has also been proposed to use an alkaline developer or alkaline aqueous solution as a developer for photosensitive resin compositions with a photopolymerizable monomer added as a crosslinking auxiliary thereto (Japanese Patent Application Laid-Open Nos. 183439/1988 and 100424/1993). In these processes, special crosslinking monomers such as those having an isocyanate structure or a urethane structure are added as the photopolymerizable monomers. Since the base polymers have no photopolymerizable group in their structures, there is a problem that sensitivity and resolution are insufficient.

Most of the photosensitive polyimide resin materials known to date have a coefficient of thermal expansion higher than 30 ppm/° C. in terms of a polyimide film formed by patterning on a substrate. Therefore, the coefficient of thermal expansion greatly differs from that of the substrate (in particular, a metal substrate having a coefficient of thermal expansion of 20 ppm/° C. or lower), which causes problems such as separation of the polyimide film from the substrate, distortion of a pattern form and warpage of the substrate. Therefore, such photosensitive polyimide resin materials have involved a problem of reliability from the viewpoint of minute processing, and their applications have also been limited. Besides, the conventional photosensitive polyimide resin materials have been developed mainly with an organic solvent, and it has thus been desired to develop a photosensitive resin material developable with an aqueous developer.

SUMMARY OF THE INVENTION

It is an object of the present invention to provide a photosensitive polyimide resin composition, which can be developed with an alkaline developer or alkaline aqueous solution and permits the formation of a polyimide film low in residual stress and coefficient of thermal expansion.

Another object of the present invention is to provide a polyamic acid which can provide a photosensitive polyimide resin composition having such excellent features.

A further object of the present invention is to provide a polyimide film having excellent film properties, and a process for forming a pattern of the polyimide film.

In the course of advancing the research and development of photosensitive polyimide resin compositions, the present inventors found that photosensitive polyimide resin compositions which are excellent in resist properties such as sensitivity and have high storage stability can be obtained by using a polyamic acid having a structure that the terminals of a polyamic acid have been modified with an aminobenzene derivative or trimellitic acid derivative which has substituent groups having a photopolymerizable carbon—carbon double bond in its molecule (Japanese Patent Application Laid-Open Nos. 82931/1996 and 95247/1996). Since these terminal-modified polyamic acids have a structure that the terminals thereof have been modified with the aminobenzene derivative or trimellitic acid derivative having the specific structure, there can be provided photosensitive polyimide resin compositions which are excellent in storage stability, can be composed of only a polymer having a high molecular weight and permit the formation of a film high in sensitivity and comparatively low in residual stress.

The present inventors have carried out a further investigation as to the properties of the photosensitive resin compositions making use of such a terminal-modified polyamic acid. As a result, it has been found that when the structure of a main chain of the terminal-modified polyamic acid is adjusted, a film formed from a resin composition containing such a polyamic acid can be developed with an alkaline developer or alkaline aqueous solution, and a good pattern can be formed.

Since such a polyamic acid has photosensitive groups only at its terminal sites, the crosslinking density thereof is generally supplied by adding a crosslinking auxiliary (photocrosslinkable monomer; photosensitive auxiliary). After exposure, the crosslinking auxiliary is photopolymerized with the terminal crosslinkable groups introduced into the main-chain skeleton at the exposed portion, thereby reducing their solubility in organic solvents. Therefore, a pattern corresponding to an unexposed portion can be formed by using an organic solvent as a developer. On the other hand, since the carboxyl groups in the main-skeleton of the terminal-modified polyamic acid are not restricted, the polyamic acid can be expected to exhibit good solubility in alkaline developers and alkaline aqueous solutions if the content of the carboxyl group is adjusted.

Therefore, the present inventors have carried out an investigation as to the termihal-modified polyamic acid with a view toward imparting moderate solubility in the alkaline developers and alkaline aqueous solutions thereto without lowering film properties to form a good pattern. As a result, it has been found that when the repeating unit of a polyamic acid formed by condensation of a diamine compound with a tetracarboxylic acid or an anhydride thereof is defined as a unit molecular weight, and the polyamic acid is adjusted in such a manner that a unit molecular weight per carboxyl group (unit molecular weight/COOH) falls within a range of from 200 to 300, the polyamic acid can be provided as that having moderate solubility in the alkaline developers and alkaline aqueous solutions and permitting the formation of a good pattern.

The terminal-modified polyamic acid according to the present invention is easy to synthesize and high in degree of freedom of selection of the acid anhydride and diamine for the main-chain skeleton. In addition, the molecular weight of the polyamic acid can be easily controlled by changing the rate of modification at terminals. When a photosensitive resin composition containing this terminal-modified polyamic acid is used to form a film on a substrate, and the film is exposed, the crosslinking auxiliary and the modified parts at the terminals undergo polymerization, thereby reducing the solubility of the exposed portion due to increase of molecular weight. The polymerization of the crosslinking auxiliary prevents the infiltration of a developer, so that a difference in solubility arises between the exposed and unexposed portions, thereby permitting the formation of a pattern.

The present inventors have carried out a further investigation as to the relation between film properties such as residual stress and coefficient of thermal expansion, and the main-chain structure of the polyamic acid. As a result, it has been found that the residual stress and coefficient of thermal expansion of a polyimide film formed on a substrate can be markedly lowered by selecting the kinds of monomers (i.e., a tetracarboxylic acid or a tetracarboxylic anhydride thereof and a diamine compound) for the polyamic acid and the combination thereof, a ratio between the monomers, and the like.

For the photosensitive resin composition according to the present invention, an alkaline developer or alkaline aqueous solution can be used as a developer. In particular, the fact that the alkaline aqueous solution can be used as a developer has many advantages such as reduction in development costs (developer cost and waste water treatment cost), to make explosion-proof apparatus unnecessary, and high safety for human body. When the pH of the alkaline developer or alkaline aqueous solution is adjusted to 10.0 or higher, the developability of the resin composition can be further improved. In addition, an aqueous rinsing liquid can be used, whereby advantages from the viewpoints of cost, and safety for apparatus and human body are increased. The inhibition of a reaction between the carboxyl groups in the main-chain structure and copper wiring (copper migration) can be achieved by incorporating a tetrazole derivative into the photosensitive resin composition. In addition, since a polyimide film formed with the photosensitive resin composition according to the present invention is low in residual stress and coefficient of thermal expansion, problems such as its separation from the substrate, distortion of a pattern form and warpage of the substrate are solved.

The present invention has been led to completion on the basis of these findings.

According to the present invention, there is thus provided a photosensitive polyimide resin composition comprising:

(A) a polyamic acid having, in its main chain, repeating units formed from a polycondensation product of at least one tetracarboxylic acid or anhydride thereof with at least one diamine compound, and represented by a formula (1):

(1)

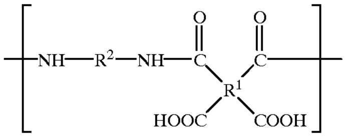

wherein $R^1$ is a tetravalent organic group, and $R^2$ is a bivalent organic group, and having actinic ray-sensitive functional groups at both terminals thereof;

(B) a photosensitive auxiliary having a photopolymerizable functional group;

(C) a photopolymerization initiator; and (D) a solvent, wherein ① the polyamic acid is such that when the repeating unit represented by the formula (1) is defined as a unit molecular weight, a unit molecular weight per carboxyl group (unit molecular weight/COOH) falls within a range of from 200 to 300, and ② the photosensitive resin composition permits the formation of a polyimide film having a residual stress of 40 MPa or lower and a coefficient of thermal expansion of 30 ppm/° C. or lower on a substrate.

According to the present invention, there is also provided a polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonete-tetracarboxylic dianhydride, with diamine compounds consisting of 30 to 99 mol % of 4,4'-diaminobenzanilide and 1 to 70 mol % of 2,2-di-trifluoromethyl-4,4'-diaminobiphenyl.

According to the present invention, there is further provided a polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonetetracarboxylic dianhydride, with diamine compounds consisting of 30 to 99 mol % of 4,4'-diaminobenzanilide and 1 to 70 mol % of 1,4-bis(4-aminophenoxy)-benzene.

According to the present invention, there is still further provided a pattern forming process, comprising the steps of coating a substrate with the photosensitive polyimide resin composition described above to form a film, subjecting the film to patterning exposure, and then developing the thus-exposed film with an alkaline developer or alkaline aqueous solution.

According to the present invention, there is yet still further provided a polyimide film obtained by coating a substrate with a photosensitive resin composition comprising:

(A) a polyamic acid having, in its main chain, repeating units formed from a polycondensation product of at least one tetracarboxylic acid or anhydride thereof with at least one diamine compound, and represented by a formula (1):

(1)

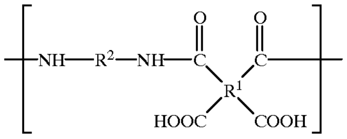

wherein $R^1$ is a tetravalent organic group, and $R^2$ is a bivalent organic group, wherein the polyamic acid is such that when the repeating unit represented by the formula (1) is defined as a unit molecular weight, a unit molecular weight per carboxyl group (unit molecular weight/COOH) falls within a range of from 200 to 300, and actinic ray-sensitive functional groups are introduced at both terminals thereof;

(B) a photosensitive auxiliary having a photopolymerizable functional group;

(C) a photopolymerization initiator; and (D) a solvent, drying the composition to form a film, subjecting the film to exposure, and then heat-treating the thus-exposed film, wherein the polyimide film on the substrate has a residual stress of 40 MPa or lower and a coefficient of thermal expansion of 30 ppm/° C. or lower.

DETAILED DESCRIPTION OF PREFERRED EMBODIMENTS (A) Polyamic Acid:

The polyamic acid useful in the practice of the present invention is a polyamic acid having, in its main chain, repeating units formed from a polycondensation product of at least one tetracarboxylic acid or anhydride thereof with at least one diamine compound, and represented by a formula (1):

(1)

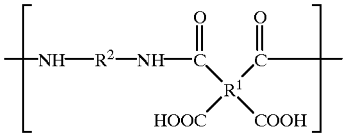

wherein $R^1$ is a tetravalent organic group, and $R^2$ is a bivalent organic group, and having actinic ray-sensitive functional groups at both terminals thereof. $R^1$ is a tetravalent organic group derived from said at least one tetracarboxylic acid or dianhydride thereof, and $R^2$ is a bivalent group derived from said at least one diamine compound.

No particular limitation is imposed on the actinic ray-sensitive functional group from the viewpoints of developability with an alkaline aqueous solution, and the residual stress and coefficient of thermal expansion of a polyimide film formed. However, from the overall points of view such as sensitivity of exposure, easiness of synthesis and film properties, it is preferred that the actinic ray-sensitive functional group be a group $Z^1$ represented by a formula (2):

(2)

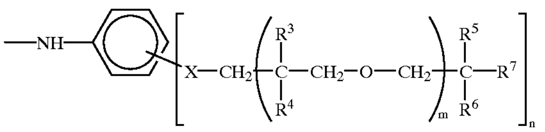

wherein X is a single bond, —O—, —CO—, —COO—, —OCO—, —OCOO—, —$COCH_2O$—, —S—, —SO—, —$SO_2$— or —$SO_{20}$—, $R^3$, $R^4$, $R^5$, $R^6$ and $R^7$ are independently a substituent group having a photopolymerizable carbon—carbon double bond, m is 0 or 1, and n is an integer within a range of from 1 to 3. In this case, the polyamic acid comes to a polyamic acid (A1) represented by a formula (3):

(3)

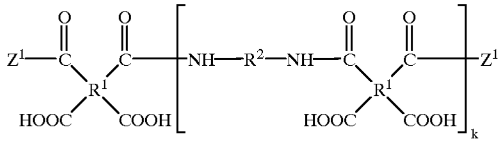

wherein $R^1$ is a tetravalent organic group, $R^2$ is a bivalent organic group, k is an integer within a range of from 5 to 10,000, and $Z^1$ is the actinic ray-sensitive functional group represented by the formula (2).

From the same points of view as described above, it is also preferred that the actinic ray-sensitive functional group be a group $Z^2$ represented by the formula (4):

(4)

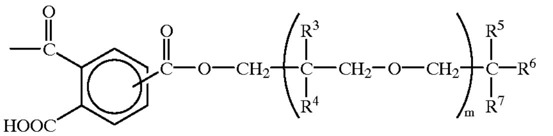

wherein $R^3$, $R^4$, $R^5$, $R^6$ and $R^7$ are independently a substituent group having a photopolymerizable carboncarbon double bond, and m is 0 or 1. In this case, the polyamic acid comes to a polyamic acid (A2) represented by a formula (5):

(5)

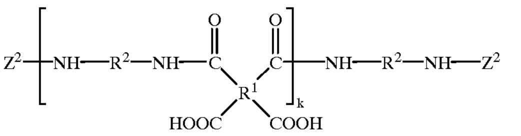

wherein $R^1$ is a tetravalent organic group, $R^2$ is a bivalent organic group, k is an integer within a range of from 5 to 10,000, and $Z^2$ is the actinic ray-sensitive functional group represented by the formula (4).

The polyamic acid can be synthesized by subjecting at least one tetracarboxylic acid or anhydride thereof and at least one diamine compound in a polar organic solvent in accordance with a method known per se in the art. As apparent from the repeating unit of the polyamic acid represented by the formula (1), the individual monomers are used in almost equimolar proportions. However, in order to introduce the actinic ray-sensitive functional groups at both terminals of the polyamic acid, a compound having a photopolymerizable carbon—carbon double bond and reactivity to the tetracarboxylic acid or the anhydride thereof, or to the diamine compound is generally caused to exist upon the polycondensation of these monomer components.

The polyamic acid (A1) having the actinic ray-sensitive functional groups $Z^1$ at both terminals thereof is generally obtained by adding at least one tetracarboxylic acid or anhydride thereof to a mixture of at least one diamine compound and an aminobenzene derivative such as tris (methacryloyl)-pentaerythritol p-aminobenzoate and subjecting these components to a polycondensation reaction in accordance with a method known per se in the art. According to this process, a polymer having a high molecular weight can be stably obtained. The polyamic acid (A2) is generally obtained by adding at least one trimellitic acid derivative such as the tris(methacryloyl)-pentaerythritol ester of trimellitic anhydride and at least one tetracarboxylic acid or anhydride thereof to at least one diamine compound and subjecting these components to a condensation reaction in accordance with a method known per se in the art. The polyamic acid (A1) is also obtained by adding a terminal-modifying agent such as aminobenzenesulfonic acid to a polymer obtained by subjecting the diamine compound and the tetracarboxylic acid or the anhydride thereof to a condensation reaction in accordance with a method known per se in the art, and then reacting them. According to these processes, polymers having a high molecular weight can be stably obtained.

<Diamine compound>

Examples of the diamine compound used in the present invention include aromatic diamines such as 4,4'-diaminobenzanilide, 2,2'-di-trifluoromethyl-4,4'-diaminobiphenyl, 2,2'-di(p-aminophenyl)-6,6'-bibenzoxazole, 2,2'-di(p-aminophenyl)-5,5'-bibenzoxazole, m-phenylenediamine, 1-isopropyl-2,4-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, 1,4-bis(4-aminophenoxy) benzene, benzidine, 4,4"-diamino-p-terphenyl, 3,3"-diamino-p-terphenyl, bis(p-aminocyclohexyl)methene, bis (p-β-amino-t-butylphenyl) ether, bis(p-β-methyl-δ-aminopentyl)benzene, p-bis(2-methyl-4-aminopentyl) benzene, p-bis(1,1,-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine and p-xylylenediamine; heterocyclic diamines such as 2,6-diaminopyridine, 2,5-diaminopyridine and 2,5-diamino-1,3,4-oxadiazole; alicyclic diamines such as 1,4-diaminocyclohexane; aliphatic diamines such as piperazine, methylenediamine, ethylenediamine, propylenediamine, 2,2-dimethylpropylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 5-methylnonamethylenediamine, 2,5-dimethylnonamethylenediamine, decamethylenediamine, 1,10-diamino-1,10-dimethyldecane, 2,11-diaminododecane, 1,12-diaminooctadecane, 2,12-diaminooctadecane and 2,17-diaminoeicosane; diaminosiloxane; 2,6-diamino-4-carboxylic benzene; and 3,3'-diamino-4,4'-dicarboxylic benzidine.

These diamine compounds may be used either singly or in any combination thereof. Of these, 4,4'-diaminobenzanilide, 2,2'-di-trifluoromethyl-4,4'-diaminobiphenyl, 4,4'-diaminodiphenyl ether and 1,4-bis(4-aminophenoxy) benzene are particularly preferred because a polymer having moderate solubility in alkaline developers and high heat resistance can be provided.

Therefore, $R^2$ in the formula (1) is a bivalent organic group derived from at least one diamine compound such as an aromatic diamine, heterocyclic diamine, alicyclic diamine or aliphatic diamine.

<Tetracarboxylic acid or the anhydride thereof>

Examples of the tetracarboxylic acid or the tetracarboxylic anhydride thereof used in the present invention include aromatic tetracarboxylic dianhydrides such as pyromellitic dianhydride, 3,3',4,4'-benzophenonetetracarboxylic dianhydride, benzene-1,2,3,4-tetracarboxylic dianhydride, 2,2'-3,3'-benzophenonetetracarboxylic dianhydride, 2,3,3', 4'-benzophenonetetracarboxylic dianhydride, naphthalene-2,3,6,7-tetracarboxylic dianhydride, naphthalene-1,2,5,6-tetracarboxylic dianhydride, naphthalene-1,2,4,5-tetracarboxylic dianhydride, naphthalene-1,2,5,8-tetracarboxylic dianhydride, naphthalene-1,2,6,7-tetracarboxylic dianhydride, 4,8-dimethyl-1,2,3,5,6,7-hexahydronaphthalene-1,2,5,6-tetracarboxylic dianhydride, 4,8-dimethyl-1,2,3,5,6,7-hexahydro-naphthalene-2,3,6,7-tetracarboxylic dianhydride, 2,6-dichloronaphthalene1,4,5, 8-tetracarboxylic dianhydride, 2,7-dichloronaphthalene-1,4, 5,8-tetracarboxylic dianhydride, 2,3,6,7-tetrachloro-naphthalene-1,4,5,8-tetracarboxylic dianhydride, 1,4,5,8-tetrachloronaphthalene-2,3,6,7-tetracarboxylic dianhydride, 3,3',4,4'-diphenyltetracarboxylic dianhydride, 2,2',3, 3'diphenyltetracarboxylic dianhydride, 2,3,3',4'-diphenyltetracarboxylic dianhydride, 2,3",4,4"-p-terphenyltetracarboxylic dianhydride, 2,2",3,3"-p-terphenyltetracarboxylic dianhydride, 2,3,3 ",4"-p-terphenyltetracarboxylic dianhydrlde, 2,2-bis(2,3-dicarboxyphenyl)propane dianhydride, 2,2-bis(3,4-dicarboxyphenyl)propane dianhydride, bis(2,3 dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic dianhydride, perylene-3,4,9,10-tetracarboxylic dianhydride, perylene-4,5,10,11-tetracarboxylic dianhydride, perylene-5,6,11,12-tetracarboxylic dianhydride, phenanthrene-1,2,7,8-tetracarboxylic dianhydride, phenanthrene-1,2,6,7-tetracarboxylic dianhydride and phenanthrene-1,2,9,10-tetracarboxylic dianhydride, and hydrogenated products thereof; alicyclic dianhydrides such as cyclopentane-1,2,3, 4-tetracarboxylic dianhydride, cyclobutane-tetracarboxylic dianhydride, bicyclo[2,2,2]octa-7-en-2-exo,3-exo,5-exo,6-exotetracarboxylic acid 2,3:5,6-dianhydride and bicyclo[2, 2,1]heptane-2-exo,3-exo,5-exo,6-exotetracarboxylic acid 2,3:5,6-dianhydride; and heterocyclic derivative dianhydrides such as pyrazine-2,3,5,6-tetracarboxylic dianhydride, pyrrolidine-2,3,4,5-tetracarboxylic dianhydride and thiophene-2,3,4,5-tetracarboxylic dianhydride.

These compounds may be used either singly or in any combination thereof. Of these, pyromellitic dianhydride, 3,3',4,4'-benzophenonetetracarboxylic dianhydride, and a combination thereof are particularly preferred from the viewpoint of the realization of low thermal expansion, good resistance to cracking and high resolution.

Therefore, $R^1$ in the formula (1) is a tetravalent organic group derived from at least one tetracarboxylic acid or dianhydride thereof, such as an aromatic tetracarboxylic dianhydride or a hydrogenated product thereof, an alicyclic dianhydride, or a heterocyclic dirivative dianhydride.

<Aminobenzene derivative>

In the present invention, an aminobenzene derivative is used as a compound which reacts with carboxyl groups of the tetracarboxylic acid or the dianhydride thereof to give the substituent group $Z^1$ represented by the formula (2).

Examples of such an aminobenzene derivative include compounds represented by the following formula (6):

(6)

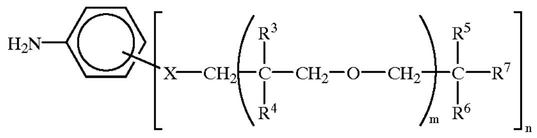

wherein X is a single bond, —O—, —CO—, —COO—, —OCO—, —OCOO—, —$COCH_2O$—, —S—, —SO—, —$SO_2$— or —$SO_2O$—, $R^3$, $R^4$, $R^5$, $R^6$ and $R^7$ are independently a substituent group having a photopolymerizable carbon—carbon double bond, m is 0 or 1, and n is an integer within a range of from 1 to 3.

Typical examples of the substituent group having a photopolymerizable carbon—carbon double bond include acryloyloxymethylene and methacryloyloxymethylene groups. Besides, alkenyl groups having 2 to 6 carbon atoms, such as vinyl, propenyl, isopropenyl, butenyl, pentinyl, hexynyl and 2-ethylbutenyl groups, and substituted groups thereof may be mentioned. Specific examples of substituents capable of being bonded to the alkenyl groups having 2 to 6 carbon atoms include halogen atoms, a phenyl group, alkyl groups having 1 to 4 carbon atoms and alkoxy groups having 1 to 4 carbon atoms.

When X in the formula (6) is —COO—, the aminobenzene derivative comes to an aminobenzenecarboxylic ester represented by the following formula (7):

(7)

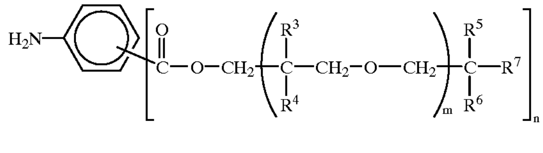

wherein $R^3$ to $R^7$, m and n have the same meanings as defined above.

Such an aminobenzenecarboxylic ester can be prepared in accordance with the process described in Japanese Patent Application Laid-Open No. 82931/1996, the disclosure of which is incorporated herein by reference.

The aminobenzenecarboxylic ester has a structure represented by the formula (7). In this ester, an amino group and 1 to 3 carboxylic ester residues are boned to the benzene ring. The bonding site of the carboxylic ester residue to the amino group may be any of o-, m- and p-positions.

Specific examples of the aminobenzenecarboxylic ester include tris(methacryloyl)pentaerythritol o-aminobenzoate, tris(acryloyl)pentaerythritol o-aminobenzoate, tris (methacryloyl)pentaerythritol m-aminobenzoate, tris (acryloyl)pentaerythritol m-aminobenzoate, tris (methacryloyl)pentaerythritol p-aminobenzoate, tris (acryloyl)pentaerythritol p-aminobenzoate, tris (methacryloyl)pentaerythritol di-5-aminoisophthalate, tris (acryloyl)pentaerythritol di-5-aminoisophthalate, pentakis (methacryloyl)dipentaerythritol o-aminobenzoate, pentakis (acryloyl)dipentaerythritol o-aminobenzoate, pentakis (methacryloyl)dipentaerythritol m-aminobenzoate, pentakis (acryloyl)dipentaerythritol m-aminobenzoate, pentakis (methacryloyl)dipentaerythritol p-aminobenzoate and pentakis(acryloyl)dipentaerythritol p-aminobenzoate.

Of these, tris(methacryloyl)pentaerythritol p-aminobenzoate is particularly preferred because it is excellent in points of synthesizing cost, handling properties, sensitivity, resolution and the like.

In order to synthesize the polyamic acid (A1) with the actinic ray-sensitive functional groups $Z^1$ represented by the formula (2) introduced at both terminals thereof, at least one tetracarboxylic acid or anhydride thereof is added to a mixture of at least one diamine compound and an aminobenzene derivative, and these components are subjected to a polycondensation reaction in accordance with a method known per se in the art. More specifically, in order to synthesize the polyamic acid (A1) with the actinic ray-sensitive functional groups introduced at both terminals thereof, the individual components are used in the following proportions. Namely, ① the diamine compound is generally used in a proportion of 0.850 to 0.990 moles, preferably 0.900 to 0.970 moles per mole of the tetracarboxylic acid or the anhydride thereof, ② the aminobenzene derivative is generally used in a proportion of 0.400 to 0.020 moles, preferably 0.110 to 0.040 moles, more preferably of 0.100 to 0.050 moles per mole of the diamine compound, and ③ the diamine compound and the aminobenzene derivative are generally used in a proportion of 1.100 to 0.900 moles, preferably 1.100 to 0.950 moles, more preferably 1.060 to 0.990 moles in total per mole of the tetracarboxylic acid or the anhydride thereof. In order to conduct the polycondensation reaction, it is only necessary to react the individual components with one another in a polar organic solvent such as dimethylacetamide in accordance with a method known per se in the art. The reaction is generally conducted at the range of from −20° C. to +80° C., for from 0.5 to 80 hours. When the monomers have low solubility in a reaction system, the monomers may be subjected to a pretreatment such as the monomers are heated to a temperature, at which they are soluble, to react them into an oligomer soluble in the reaction system. However, the polyamic acid (A1) used in the present invention is not limited to that obtained by the specific synthesizing process.

<Trimellitic acid derivative>

In the present invention, a trimellitic acid derivative having a specific structure is used as a compound which gives the substituent group $Z^2$ represented by the formula (4) to both terminals of a polyamic acid. That is, such a trimellitic acid derivative is represented by the following formula (8):

(8)

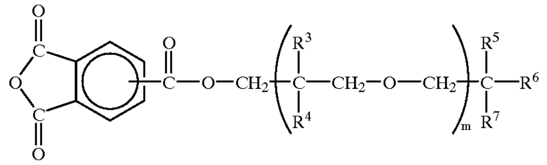

wherein $R^3$, $R^4$, $R^5$, $R^6$ and $R^7$ are independently a substituent group having a photopolymerizable carbon—carbon double bond, and m is 0 or 1.

Typical examples of the substituent group having a photopolymerizable carbon—carbon double bond include acryloyloxymethylene and methacryloyloxymethylene groups. Besides, alkenyl groups having 2 to 6 carbon atoms, such as vinyl, propenyl, isopropenyl, butenyl, pentinyl, hexynyl and 2-ethylbutenyl groups, and substituted groups thereof may be mentioned. Specific examples of substituents capable of being bonded to the alkenyl groups having 2 to 6 carbon atoms include halogen atoms, a phenyl group, alkyl groups having 1 to 4 carbon atoms and alkoxy groups having 1 to 4 carbon atoms.

Such a trimellitic acid derivative can be synthesized in accordance with the process described in Japanese Patent Application Laid-Open No. 95247/1996, the disclosure of which is incorporated herein by reference.

Typical trimellitic acid derivatives used in the present invention are compounds represented by a formula (9):

(9)

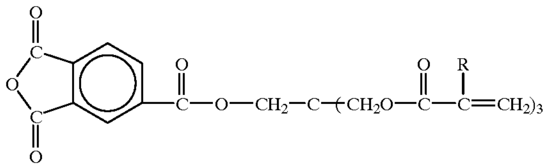

wherein R is a hydrogen atom or a lower alkyl group having 1 to 5 carbon atoms.

Particularly preferred trimellitic acid derivatives are the tris(acryloyl)pentaerythritol ester of trimellitic anhydride [a compound in which R in the formula (9) is H] and the tris(methacryloyl)-pentaerythritol ester of trimellitic anhydride [a compound in which R in the formula (9) is a methyl group] because they are excellent in points of synthesizing cost, handling properties, sensitivity, resolution and the like.

In order to synthesize the polyamic acid (A2) with the actinic ray-sensitive functional group $Z^2$ represented by the formula (4) introduced at both terminals thereof, a trimellitic acid derivative and at least one tetracarboxylic acid or anhydride thereof are added to at least one diamine compound, and these components are subjected to a condensation reaction in accordance with a method known per se in the art. Alternatively, at least one tetracarboxylic acid or anhydride thereof may be added to a mixture of at least one diamine compound and a trimellitic acid derivative, and these components are subjected to a condensation reaction in accordance with a method known per se in the art. More specifically, in order to synthesize the polyamic acid (A2) with the actinic ray-sensitive functional group introduced at both terminals thereof, the individual components are used in the following proportions. Namely, ① the tetracarboxylic acid or the anhydride thereof is generally used in a proportion of 0.850 to 0.990 moles, more preferably 0.900 to 0.970 moles per mole of the diamine compound, ② the trimellitic acid derivative is generally used in a proportion of 0.400 to 0.020 moles, preferably 0.110 to 0.040 moles, more preferably 0.100 to 0.050 moles per mole of the tetracarboxylic acid or the anhydride thereof, and ③ the tetracarboxylic acid or the anhydride thereof and the trimellitic acid derivative are generally used in a proportion of 1.100 to 0.900 moles, preferably 1.100 to 0.990 moles, more preferably 1.060 to 1.020 moles in total per mole of the diamine compound. In order to conduct the condensation reaction, it is only necessary to react the individual components with one another in a polar organic solvent such as dimethylacetamide in accordance with a method known per se in the art. The reaction is generally conducted at the range of from −20° C. to +80° C., for from 0.5 to 80 hours. When the monomeres have low solubility in a reaction system, the monomeres may be subjected to a pretreatment such as the monomers are heated to a temperature, at which they are soluble, to react them into an oligomer soluble in the reaction system. However, the polyamic acid (A2) used in the present invention is not limited to that obtained by the specific synthesizing process.

<Polyamic acid>

The polyamic acid useful in the practice of the present invention has repeating units represented by the formula (1) in its main chain, and actinic ray-sensitive functional groups at both terminals thereof.

In the present invention, the kinds of the monomers for the polyamic acid and the combination thereof are selected so as to make the photosensitive polyimide resin composition containing the polyamic acid developable with an alkaline developer or alkaline aqueous solution. In the present invention, the kinds of the monomers and the combination thereof are also selected so as to make the coefficient of thermal expansion and residual stress of a polyimide film formed from the photosensitive resin composition low. The selection of the kinds of the monomers and the combination thereof is conducted as to both the tetracarboxylic acid or the anhydride thereof (hereinafter typified by the tetracarboxylic dianhydride) and the diamine compound.

In order to make the photosensitive polyimide resin composition developable with an alkaline developer or aLkaline aqueous solution, the kinds of the monomers and the combination thereof are selected in such a manner that when the repeating unit represented by the formula (1) is defined as a unit molecular weight, a unit molecular weight per carboxyl group, i.e., a ratio of unit molecular weight/COOH falls within a range of from 200 to 300. If the unit molecular weight per carboxyl group is too low, the resulting polyamic acid becomes extremely easy to dissolve in an alkaline developer or a developer composed of an alkaline aqueous solution. Therefore, when a resist film is formed with a photosensitive resin composition comprising such a pcolyamic acid, the formation of a pattern becomes difficult, or impossible in some cases. If the unit molecular weight is too high on the other hand, the polyamic acid becomes hardly soluble in an alkaline developer or a developer composed of an alkaline aqueous solution, or insoluble in some cases, so that the formation of a pattern becomes infeasible. From the viewpoint of the balance between. the developability with the alkaline developer or the developer composed of an alkaline aqueous solution and film properties, the unit molecular weight per carboxyl group is preferably within a range of from 205 to 295, more preferably from 230 to 280). However, the photosensitive resin composition according to the present invention may be developed with an organic solvent as needed. When the polyamic acid has plural kinds of the repeating units represented by the formula (1) (that is, the polyamic acid is a copolymer), the (unit molecular weight/COOH) value is calculated on the basis of mol % of the respective repeating units.

In the present invention, the kinds of the monomers used and the combination thereof are also selected in such a manner that the residual stress and coefficient of thermal expansion of a polyimide film formed on a substrate using the photosensitive resin composition comprising the polyamic acid are 40 MPa or lower, preferably 35 MPa or lower, and 30 ppm/° C. or lower, preferably 25 ppm/° C. or lower, respectively. In this case, various factors of the respective monomers, such as stiffness and flexibility of their structures, and bulkiness, are investigated to select the kinds of preferred monomers and the combination thereof. In most cases, the lower limit of the residual stress is about 3 MPa. The lower limit of the coefficient of thermal expansion is about 1 ppm/° C. in most cases.

Particularly preferred tetracarboxylic dianhydrides from the viewpoints of developability with the alkaline aqueous solution and low coefficient of thermal expansion include pyromellitic dianhydride represented by a formula (10):

(10)

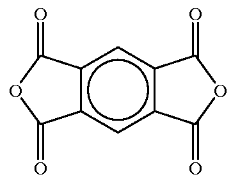

and 3,3',4,4'-benzophenonetetracarboxylic dianhydride represented by a formula (11):

(11)

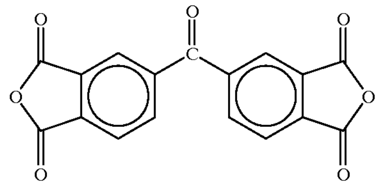

On the other hand, particularly preferred diamine compounds from the viewpoints of developability with the alkaline aqueous solution and low coefficient of thermal expansion include 4,4'-diaminobenzanilide represented by a formula (12):

(12)

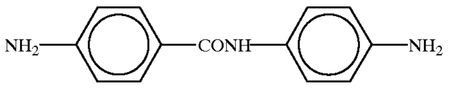

2,2'-di-trifluoromethyl-4,4'-diaminobiphenyl represented by a formula (13):

(13)

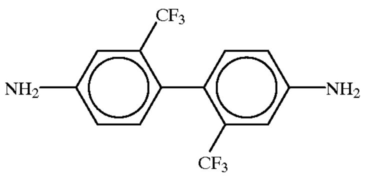

4,4'-diaminodiphenyl ether represented by a formula (14):

(14)

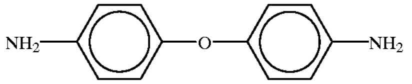

and 1,4-bis(4-aminophenoxy)benzene represented by a formula (15):

(15)

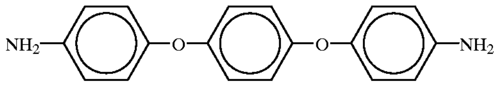

Specifically, particularly preferred kinds of the tetracarboxylic dianhydride and the diamine compound, and the combination thereof from the viewpoints of developability with the alkaline aqueous solution and low coefficient of thermal expansion are as follows:

1. A combination of pyromellitic dianhydride and 4,4'-diaminobenzanilide. The combination of these monomers can provide a polyamic acid having, in its main chain, repeating units represented by a formula (16):

k1 and k2 in the respective formulae mean the numbers of their corresponding repeating units in the copolymer, and the total number thereof is an integer within a range of from 5 to 10,000.

3. A combination of the tetracarboxylic dianhydride(s) consisting of 30 to 100 mol %, preferably 40 to 90 mol %, more preferably 50 to 80 mol % of pyromellitic dianhydride and 0 to 70 mol %, preferably 10 to 60 mol %, more preferably 20 to 50 mol % of 3,3',4,4'-benzophenonetetracarboxylic dianhydride, and the diamine compounds consisting of 30 to 99 mol %, preferably 40 to 95 mol %, more preferably 50 to 90 mol % of 4,4'-diaminobenzanilide and 1 to 70 mol %, preferably 5 to 60 mol %, more preferably 10 to 50 mol % of 2,2'-ditrifluoromethyl-4,4'-diaminobiphenyl.

The combination of these four monomers can provide a polyamic acid (copolymer) having, in its main chain, the repeating units represented by the formulae (16) and (17), and besides repeating units represented by a formula (18):

(16)

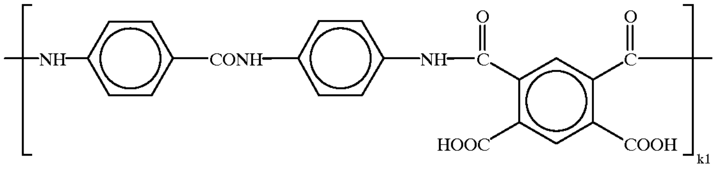

wherein k1 means the number of repeating units and is generally an integer within a range of from 5 to 10,000.

2. A combination of the tetracarboxylic dianhydride(s) consisting of 30 to 100 mol %, preferably 40 to 90 mol %, more preferably 50 to 80 mol % of pyromellitic dianhydride and 0 to 70 mol %, preferably 10 to 60 mol %, more preferably 20 to 50 mol % of 3,3',4,4'-benzophenonetetracarboxylic dianhydride, and 4,4-diaminobenzanilide. The combination of these monomers can provide a polyamic acid (copolymer) having, in its main chain, the repeating units represented by the formula (16) and repeating units represented by a formula (17):

(18)

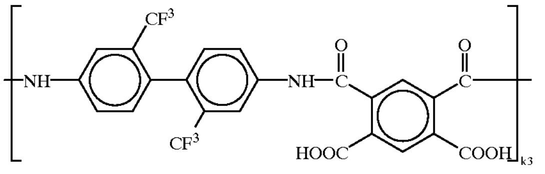

and repeating units represented by a formula (19):

(17)

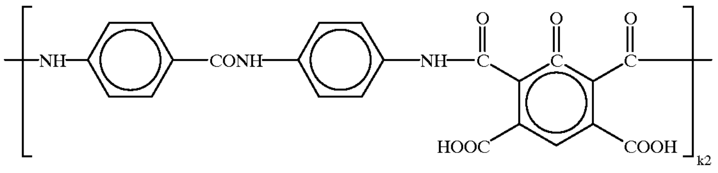

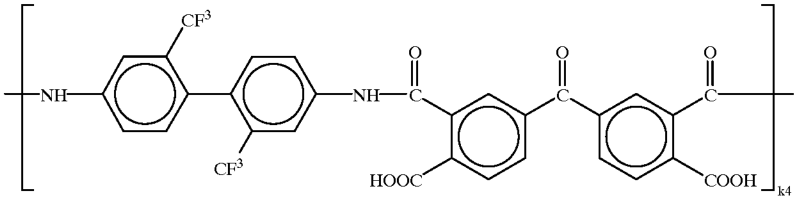

(19)

k1, k2, k3 and k4 in the respective formulae mean the numbers of their corresponding repeating units in the copolymer, and the total number thereof is an integer within a range of from 5 to 10,000.

4. A combination of the tetracarboxylic dianhydride(s) consisting of 30 to 100 mol %, preferably 40 to 90 mol %, more preferably 50 to 80 mol % of pyromellitic dianhydride and 0 to 70 mol %, preferably 10 to 60 mol %, more preferably 20 to 50 mol % of 3,3',4,4'-benzophenonetetracarboxylic dianhydride, and the diamine compounds consisting of 30 to 99 mol %, preferably 35 to 90 mol %, more preferably 40 to 80 mol % of 4,4'-diaminobenzanilide and 1 to 70 mol %, preferably 10 to 65 mol %, more preferably 20 to 60 mol % of 4,4'-diaminodiphenyl ether.

The combination of these four monomers can provide a polyamic acid (copolymer) having, in its main chain, the repeating units represented by the formulae (16) and (17), and besides repeating units represented by a formula (20):

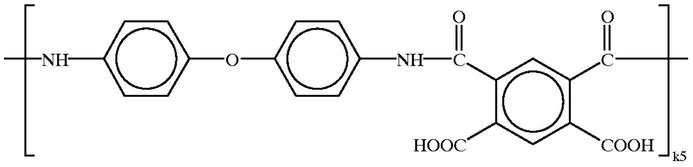

(20)

and repeating units represented by a formula (21):

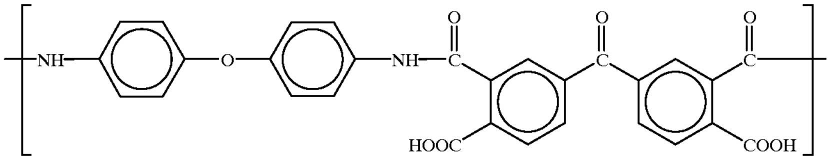

(21)

k1, k2, k5 and k6 in the respective formulae mean the numbers of their corresponding repeating units in the copolymer, and the total number thereof is an integer within a range of from 5 to 10,000.

5. A combination of the tetracarboxylic dianhydride(s) consisting of 30 to 100 mol %, preferably 40 to 90 mol %, more preferably 50 to 80 mol % of pyromellitic dianhydride and 0 to 70 mol %, preferably 10 to 60 mol %, more preferably 20 to 50 mol % of 3,3',4,4'-benzophenonetetracarboxylic dianhydride, and the diamine compounds consisting of 30 to 99 mol %, preferably 35 to 90 mol %, more preferably 40 to 80 mol % of 4,4'-diaminobenzanilide and 1 to 70 mol %, preferably 10 to 65 mol %, more preferably 20 to 60 mol % of 1,4'-bis(4-aminophenoxy)benzene.

The combination of these four monomers can provide a polyamic acid (copolymer) having, in its main chain, the repeating units represented by the formulae (16) and (17), and besides repeating units represented by a formula (22):

(22)

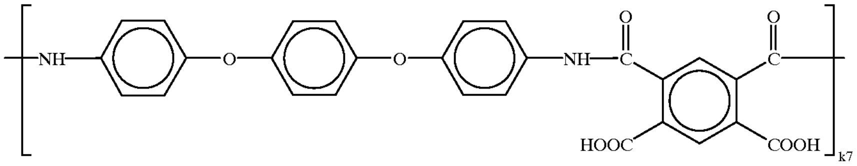

and repeating units represented by a formula (23):

(23)

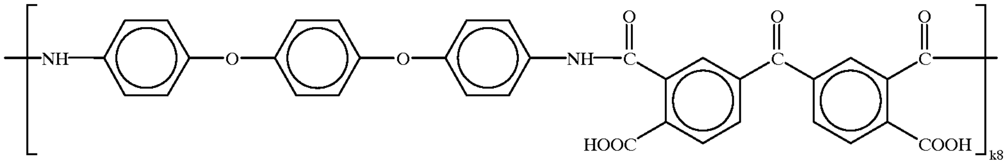

k1, k2, k7 and k8 in the respective formulae mean the numbers of their corresponding repeating units in the copolymer, and the total number thereof is an integer within a range of from 5 to 10,000.

The weight average molecular weight of each of these polyamic acids is preferably within a range of from 5,000 to 200,000, more preferably from 10,000 to 150,000, most preferably from 20,000 to 100,000. The molecular weight of the polyamic acid falls within this range, whereby the solubility in organic solvents, alkaline developer and alkaline aqueous solution, film-forming property and coating property of the resulting photosensitive resin composition become good. In order to impart photosensitivity to these polyamic acids, actinic ray-sensitive functional groups are introduced at both terminals thereof. Preferable examples of the actinic ray-sensitive functional groups include the above-described groups $Z^1$ and $Z^2$. The bonding states of the terminal groups are as represented by the formulae (3) and (5).

(B) Photosensitive Auxiliary Having a Photopolymerizable Functional Group:

No particular limitation is imposed on the photosensitive auxiliary useful in the practice of the present invention so far as it is generally known as a photosetting monomer.

Typical examples of the photosensitive auxiliary include (meth)acrylic compounds such as pentaerythritol triacrylate.

Examples of the acrylic compounds include acrylic acid, methyl acrylate, ethyl acrylate, n-propyl acrylate, isopropyl acrylate, n-butyl acrylate, isobutyl acrylate, cyclohexyl acrylate, benzyl acrylate, carbitol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acrylate, pentaerythritol monoacrylate, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl) propane, 2,2-bis(4-acryloxypropyloxyphenyl)propane, trimethylolpropane diacrylate, pentaerythritol diacrylate, trimethylolpropane triacrylate, pentaerythritol triacrylate, triacrylformal, tetramethylolmethane tetraacrylate, tris(2-hydroxyethyl)isocyanuric acid acrylate, compounds represented by a formula (24):

(24)

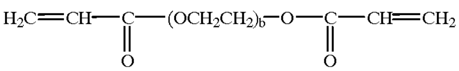

wherein b means an integer of 1 to 30, compounds represented by a formula (25):

(25)

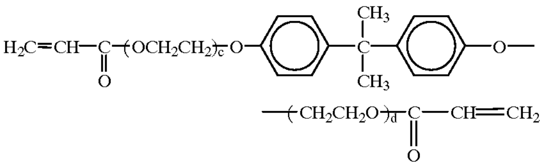

wherein c and d denote integers satisfying c+d=2–30, a compound represented by a formula (26):

(26)

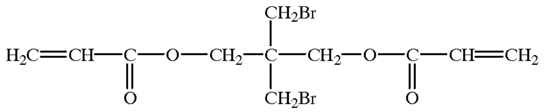

and a compound represented by a formula (27):

(27)

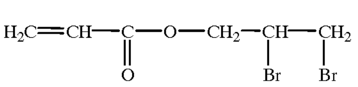

Examples of the methacrylic compounds include methacrylic acid, methyl methacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethylaminoethyl methacrylate, N,N-diethylaminoetethyl methacrylate, glycidyl methacrylate, tetrahydrofurfuryl methacrylate, methacryloxypropyltrimethoxysilane, allyl methacrylate, trimethylolpropane mcnomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxydiethoxyphenyl)propane, trimethylolpropane dimethacrylate, pentaerythritol dimethacrylate, trimethylolpropane trimethacrylate, pentaerythritol trimethacrylate, tetramethylolmethane tetramethacrylate, tris(2-hydroxyethyl) isocyanuric acid methacrylate, compounds represented by a formula (28):

(28)

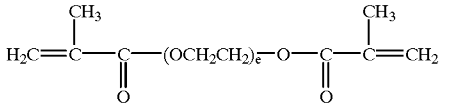

wherein e means an integer of 1 to 30, compounds represented by a formula (29):

(29)

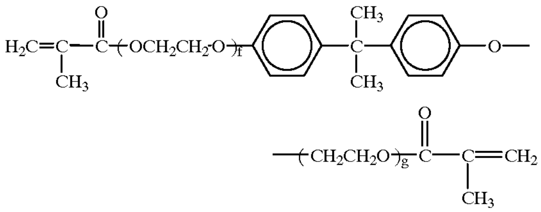

wherein f and g denote integers satisfying f+g=1–30, a compound represented by a formula (30):

(30)

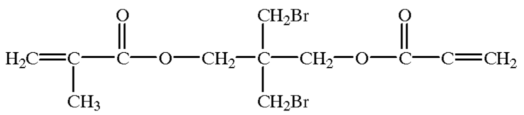

and a compound represented by a formula (31):

(31)

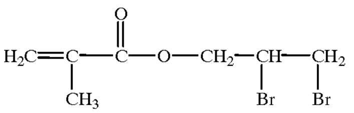

These compounds may be used either singly or in any combination thereof. Of these, pentaerythritol triacrylate and the compound (b=3) represented by the formula (24) are particularly preferred.

No particular limitation is imposed on the amount of the photosensitive auxiliary to be used so far as it is compatible with the polyamic acid. However, if the amount to be used is extremely great, the photosensitive auxiliary involves problems that it is difficult to be decomposed or removed upon the polyimidation of the polyamic acid by the heat treatment, and that the residual stress of the resulting film is increased, and so a substrate of a semiconductor device becomes liable to cause deformation such as warpage. Therefore, the photosensitive auxiliary is desirably used in a proportion of 10 to 50 parts by weight, preferably 15 to 40 parts by weight, more preferably 20 to 35 parts by weight per 100 parts by weight of (A) the polyamic acid.

(C) Photopolymerization Initiator:

Examples of the photopolymerization initiator useful in the practice of the present invention include Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9,10-anthraquinone, anthraquinone, methylanthraquinone, 4,4'-bis(diethylamino)benzophenone, acetophenone, benzophenone, thioxanthone, 1,5-acenaphthene, 2,2-dimethoxy-2-phenylacetophenone, 1-hydroxycyclohexyl phenyl ketone, 2-methyl-[4-(methylthio)phenyl]-2-morpholino-1-propanone, diacetylbenzyl, benzyldimethyl ketal, benzyldiethyl ketal, diphenyl disulfide, anthracene, phenanthrenequinone, riboflavin tetrabutyrate, acrylorange, erythrosine, phenanthrenequinone, 2-isopropylthioxanthone, 2,6-bis(p-diethylaminobenzylidene)-4-methyl-4-azacyclohexanone, 6-bis(p-dimethyaminobenzylidene)cyclopentanone, 2,6-bis (p-diethylaminobenzylidene)-4-phenylcyclohexanone, aminostyryl ketone represented by a formula (32):

(32)

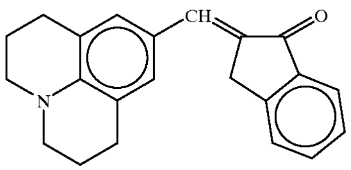

3-ketocoumarin compounds represented by a formula (33):

(33)

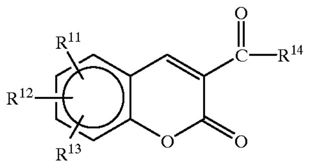

wherein $R^{14}$ is an aromatic carbon ring or heterocycle having 5 to 20 ring-forming atoms, and $R^{11}$, $R^{12}$ and $R^{13}$ are independently a hydrogen atom, a hydroxyl group, or an alkyl, dialkylamino, alkoxy or acyloxy group having 1 to 5 carbon atoms, biscoumarin compounds represented by a formula (34):

(34)

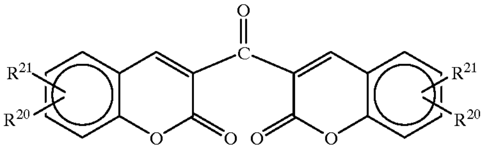

wherein $R^{20}$ and $R^{21}$ are independently a hydrogen atom, or an alkyl, dialkylamino, alkoxy or acyloxy group having 1 to 5 carbon atoms, N-phenylglycine, N-phenyldiethanolamine, and 3,3',4,4'-tetra(t-butylperoxycarbonyl)benzophenone.

No particular limitation is imposed on the amount of the photopolymerization initiator to be used. However, it is generally used in a proportion of 0.01 to 10 parts by weight, preferably 0.1 to 5 parts by weight, more preferably 1 to 5 parts by weight per 100 parts by weight of (A) the polyamide compound.

(D) Solvent:

Examples of the solvent useful in the practice of the present invention include polar solvents such as N-methyl-2-pyrrolidone, N,N-dimethylacetamide, N,N-dimethylformamide, dimethyl sulfoxide, tetramethylurea, hexamethylphosphoric triamide and γ-butyrolactone.

Besides these polar solvents, ketones such as acetone, methyl ethyl ketone, methyl isobutyl ketone and cyclohexanone; esters such as methyl acetate, ethyl acetate, butyl acetate, diethyl oxalate and diethyl malonate; ethers such as diethyl ether, ethylene glycol dimethyl ether, diethylene glycol dimethyl ether and tetrahydrofuran; halogenated hydrocarbons such as dichloromethane, 1,2-dichloroethane, 1,4-dichlorobutane, trichloroethane, chlorobenzene and o-dichlorobenzene; and hydrocarbons such as hexane, heptane, octane, benzene, toluene and xylene may also be used.

These solvent may be used either singly or in any combination thereof. Of these, N,N-dimethylacetamide and N-methyl-2-pyrrolidone are particularly preferred.

The solvent is used in an amount sufficient to uniformly dissolve the individual components. In particular, it is used in an amount sufficient to dissolve (A) the polyamic acid. The proportion of the solvent to be used varies according to the kinds of the solvent and polyamic acid used. However, it is generally used in a proportion ranging from 3 to 25 times, preferably from 5 to 20 times, more preferably from 6 to 10 times by weight as much as (A) the polyamic acid.

(E) Other Additives:

In the compositions according to the present invention, there may be further used various additives such as an adhesion auxiliary, leveling agent and polymerization inhibitor as needed.

Among the various additives, 1H-tetrazoles such as 1H-tetrazole, 5,5'-bis-1H-tetrazole or a derivative thereof is added, whereby corrosion against copper and copper alloys can be prevented, and in its turn the adhesion of the polyimide film to a substrate can be improved, and the photosensitive film can be prevented from remaining without being developed. As examples of 1H-tetrazole and derivatives thereof, may be mentioned unsubstituted 1H-tetrazole; 5-substituted 1H-tetrazoles such as 5-methyl-1H-tetrazole, 5-phenyl-1H-tetrazole and 5-amino-1H-tetrazole; 1-substituted 1H-tetrazoles such as 1-methyl-1H-tetrazole; and 1,5-disubstituted 1H-tetrazole such as 1-phenyl-5-mercapto-1H-tetrazole. Of these, 1H-tetrazole and 5-substituted 1H-tetrazoles are particularly preferred.

The 1H-tetrazoles are generally used in a proportion of 0.05 to 20 parts by weight, preferably 0.1 to 5 parts by weight, more preferably 0.3 to 3.0 parts by weight per 100 parts by weight of the polyamic acid (in terms of solid content). If this proportion is too low, the effect of the addition becomes small. If the proportion is too high on the other hand, the effect may not be brought about correspondingly to such a proportion.

The 1H-tetrazoles are generally added to a solution of the polyamic acid into a resin composition (solution). The resultant composition is used in applications for coating on a substrate or the like to form a film.

Pattern Forming Process:

The photosensitive resin composition according to the present invention is used in the following manner. The composition is first coated on a suitable substrate, for example, a silicon wafer, or a ceramic or aluminum substrate. Examples of a coating method include spin coating making use of a spin coater, spray coating making use of a spray coater, dipping, printing and roll coating. After the composition is then prebaked at a low temperature of 50 to 100° C. to dry the coating film, the coating film is exposed to actinic rays according to the desired pattern. As the actinic rays, there may be used X-rays, electron rays, ultraviolet rays, visible rays and the like. Those having a wavelength ranging from 200 to 500 nm are preferred. The unexposed portion is then dissolved in a developer to remove it, thereby obtaining a relief pattern. In the present invention, alkaline developers and alkaline aqueous solutions may be used as developers.

The alkaline developers are developers obtained by dissolving a basic compound in a solvent containing at least 50% of an organic solvent. Examples of the organic solvent include polar solvents such as N-methylpyrrolidone, N-acetylpyrrolidone, N,N'-dimethylformamide, N,N'-dimethylacetamide, dimethyl sulfoxide and γ-butyrolactone. Besides, general organic solvents, such as alcohols such as methanol and ethanol, aromatic hydrocarbons such as toluene and xylene, ketones such as acetone and methyl ethyl ketone, and ethers such as tetrahydrofuran and dioxane, or water may be used in combination with these polar solvents.

The alkaline aqueous solutions are developers obtained by dissolving a basic compound in a solvent containing at least 51% of water. Examples of other solvent components than water include aprotic polar solvents such as N-methylpyrrolidone, N,N'-dimethylformamide, N,N'-dimethylacetamide, dimethyl sulfoxide and γ-butyrolactone; alcohols such as methanol, ethanol and isopropyl alcohol; aromatic hydrocarbons such as toluene and xylene; ketones such as acetone, methyl ethyl ketone and cyclopentanone; esters such as methyl acetate and methyl lactate; ethers such as tetrahydrofuran and dioxane; diols such as ethylene glycol and diethylene glycol; and cellosolves such as ethylene glycol monomethyl ether and propylene glycol monomethyl ether.

Examples of the basic compound used include the hydroxides, carbonates, bicarbonates, silicates, phosphates, pyrophosphates, acetates and amine salts of alkali metals and quaternary ammonium. Specific examples thereof include sodium hydroxide, lithium hydroxide, potassium hydroxide, ammonium hydroxide, trimethylbenzylammonium hydroxide, tetramethylammonium hydroxide, sodium carbonate, potassium carbonate, sodium hydrogencarbonate, sodium silicate, sodium phosphate, sodium pyrophosphate, sodium acetate, monoethanolamine, diethanolamine, triethanolamine and choline. However, the basic compounds are not limited thereto.

The amount of the basic compound used is generally 0.001 to 50 parts by weight, preferably 0.05 to 30 parts by weight per 100 parts by weight of the solvent. If the amount of the basic compound used is too small, the resulting developer tends to lower its developability. If the amount is too great, the basic compound is incompletely dissolved into an uneven solution, or the alkaline concentration of the resulting solution becomes too high, so that the solubility of the polyamic acid in such a solution becomes too high, resulting in surface roughness at the unexposed portion. The basic compound is desirably used in such a proportion that the pH of the resulting developer generally amounts to 10.0 or higher, preferably falls within a range of from 11.0 to 13.5. If the pH of the developer is lower than 10.0, such a developer tends to slow developing speed. If the pH exceeds 13.5, the solubility of the polyamic acid in such a developer becomes too high, so that swelling and surface roughness occur at the unexposed portion, and a difference in solubility between the exposed portion and the unexposed portion becomes small, resulting in difficulty in forming a pattern in a good form.

As a developer, the alkaline developer and alkaline aqueous solution may be used either singly or in combination. When the alkaline developer and alkaline aqueous solution are used in combination, the amount of the organic solvent used is generally 0.1 to 100 parts by weight, preferably 1.0 to 50 parts by weight per 100 parts by weight of water. The alkaline aqueous solution, which is safer for human body and cheap, is preferably used as a developer. When the alkaline aqueous solution is used as a developer, (A) the polyamic acid is preferably such that the unit molecular weight per carboxyl group falls within a range of from 205 to 280.

As a developing method, there may be used various methods such as spray development, paddle development, dip development and ultrasonic dip development. When the unit molecular weight per carboxyl group (unit molecular weight/COOH) of the polyamic acid is near 200, the paddle development is suitable in most cases. When the unit molecular weight per carboxyl group is near 300, the ultrasonic dip development is suitable in most cases. The developing speed is also affected by the temperature of the developer. Accordingly, it is desirable that optimum conditions be set by inspecting various conditions such as the pH and temperature of the developer, and the developing method in advance.

The relief pattern formed by the development is washed with a rinsing liquid to remove the developer. Examples of the rinsing liquid include methanol, ethanol, isopropanol and water. These rinsing liquids are used singly or in combination. As the rinsing liquid, water alone or a mixture of water and an alcohol is particularly preferred.

After the rinsing, a heat treatment is conducted to form an imide ring, thereby polyimidating the polyamic acid to obtain a final pattern having high heat resistance.

The photosensitive resin compositions according to the present invention can be used not only in applications related to semiconductor devices, such as LSI buffer coats and passivation films, but also in applications such as layer insulation films for multi-layer circuits, cover coats for flexible copper-clad sheets, covering films for various kinds of metal core substrates and ceramic substrates, solder resist films, and alignment films for liquid crystals.

ADVANTAGES OF THE INVENTION

According to the present invention, there can be provided photosensitive polyimide resin compositions which can be developed with an alkaline developer or alkaline aqueous solution and permit the formation of polyimide films low in residual stress and coefficient of thermal expansion. According to the present invention, there are also provided polyamic acids which can provide photosensitive polyimide resin compositions having such various excellent properties. Further, the present invention provides polyimide films having excellent film properties, and a pattern forming process. The present invention can be applied to a wide variety of fields such as surface-protecting films and layer insulation films in fabrication of semiconductor devices, cover coats for flexible copper-clad sheets, solder resist films, and alignment films for liquid crystals.

EMBODIMENTS OF THE INVENTION

The present invention will hereinafter be described more specifically by the following Examples and Comparative Examples.

EXAMPLE 1

A reactor equipped with a stirrer and a dry gas inlet pipe was charged with 65.5 g (0.288 mol) of 4,4'-diaminobenzanilide and 693 g of dimethylacetamide, and the mixture was stirred at 50° C. into a solution. After cooling the solution to 10° C. or lower, 65.4 g (0.300 mol) of pyromellitic dianhydride and 11.02 g (0.024 mol) of tris(methacryloyl)pentaerythritol p-aminobenzoate as an amine for terminal modification were added to the solution in the form of powder. The resultant mixture was stirred for 3 hours under cooling with ice water and then for 24 hours at room temperature, thereby synthesizing a polyamic acid.

To 588 parts by weight (100 parts by weight in terms of solid content) of the polyamic acid thus obtained, were added 2 parts by weight of 3,3',4,4'-tetra(t-butylperoxycarbonyl)benzophenone (hereinafter referred to as "BTTB"; $\lambda_{MAX}$=340 nm; product of Nippon Oil & Fat Co., Ltd.), 2 parts by weight of N-phenylglycine, 0.5 parts by weight of 1H-tetrazole, and 32 parts by weight of triethylene glycol diacrylate (3 EG-A, product of Kyoeisha Chemical Co., Ltd.) as a photosensitive auxiliary at room temperature into a solution. The thus-obtained composition was coated on a silicon wafer by a spin coater and dried at 70° C. for 6 minutes on a hot plate to form a film having a thickness of about 15 μm.

This silicon wafer on which the film had been formed was exposed by means of a PLA-501F (manufactured by Canon Inc.) using a step tablet mask manufactured by TOPPAN PRINTING CO., LTD. and then subjected to ultrasonic dip development with a 0.15% aqueous solution of tetramethylammonium hydroxide (TMAH). As a result, a pattern was able to be obtained at portions to which energy of exposure of at least 200 mJ/cm$^2$ (at 436 nm) was applied.

A silicon wafer on which a film had been formed in the same manner as described above was also exposed at energy of exposure of 1,500 mJ/cm$^2$ by means of the PAL-501F using a resolution-evaluating mask manufactured by TOPPAN PRINTING CO., LTD. and then subjected to the same development as described above. As a result, even a pattern having lines and spaces at intervals of 30 μm was able to be resolved. The unit molecular weight per carboxyl group (unit molecular weight/COOH) of the polyamic acid was 222.7. The results are shown in Table 1.

EXAMPLE 2

A polyamic acid was synthesized in the same manner as in Example 1 except that 52.3 g (0.240 mol) of pyromellitic dianhydride and 19.33 g (0.060 mol) of 3,3',4,4'-benzophenonetetracarboxylic dianhydride were used in place of pyromellitic dianhydride (0.300 mol) in Example 1, and evaluation was conducted in the same manner as in Example 1. The results are shown in Table 1.

EXAMPLE 3

A polyamic acid was synthesized in the same manner as in Example 1 except that 32.7 g (0.150 mol) of pyromellitic dianhydride and 48.31 g (0.150 mol) of 3,3',4,4'-benzophenonetetracarboxylic dianhydride were used in place of pyromellitic dianhydride (0.300 mol) in Example 1, and evaluation was conducted in the same manner as in Example 1. The results are shown in Table 1.

EXAMPLE 4

A reactor equipped with a stirrer and a dry gas inlet pipe was charged with 52.3 g (0.230 mol) of 4,4'-diaminobenzanilide and 748.6 g of dimethylacetamide, and the mixture was stirred at 50° C. into a solution. To this solution were added 40.11 g (0.184 mol) of pyromellitic dianhydride and 14.81 g (0.046 mol) of 3,3',4,4'-benzophenonetetracarboxylic dianhydride to react them at a reaction temperature of 50° C. for 3 hours. After cooling the reaction mixture to 10° C. or lower, 18.44 g (0.057 mol) of 2,2'-di-trifluoromethyl-4,4'-diaminobiphenyl, 12.21 g (0.059 mol) of pyromellitic dianhydride, 4.51 g (0.014 mol) of 3,3',4,4'-benzophenonetetracarboxylic dianhydride and 11.02 g (0.024 mol) of tris(methacryloyl)pentaerythritol p-aminobenzoate as an amine for terminal modification were added in the form of powder. The resultant mixture was stirred for 3 hours under cooling with ice water and then for 24 hours at room temperature, thereby synthesizing a polyamic acid.

To 588 parts by weight (100 parts by weight in terms of solid content) of the polyamic acid thus obtained, were added 2 parts by weight of BTTB, 2 parts by weight of N-phenylglycine, 0.5 parts by weight of 1H-tetrazole, and 32 parts by weight of 3 EG-A as a photosensitive auxiliary at room temperature into a solution. The thus-obtained composition was coated on a silicon wafer by a spin coater and dried at 70° C. for 6 minutes on a hot plate to form a film having a thickness of about 15 μm.

This silicon wafer on which the film had been formed was exposed by means of a PLA-501F (manufactured by Canon Inc.) using a step tablet mask manufactured by TOPPAN PRINTING CO., LTD. and then subjected to ultrasonic dip development with a 0.15% aqueous solution of tetramethylammonium hydroxide (TMAH). As a result, a pattern was able to be obtained at portions to which energy of exposure of at least 200 $mJ/cm^2$ (at 436 nm) was applied.

A silicon wafer on which a film had been formed in the same manner as described above was also exposed at energy of exposure of 1,500 $mJ/cm^2$ by means of the PAL-501F using a resolution-evaluating mask manufactured by TOPPAN PRINTING CO., LTD. and then subjected to the same development as described above. As a result, even a pattern having lines and spaces at intervals of 25 μm was able to be resolved. The unit molecular weight per carboxyl group (unit molecular weight/COOH) of the polyamic acid was 242.4. The results are shown in Table 1.

EXAMPLE 5

A polyamic acid was synthesized in the same manner as in Example 4 except that the amounts of 4,4'-diaminobenzanilide and 2,2'-di-trifluoromethyl-4,4'-diaminobiphenyl in Example 4 were changed from 52.3 g (0.230 mol) to 55.57 g (0.244 mol) and from 18.44 g (0.057 mol) to 13.85 g (0.043 mol), respectively, and evaluation was conducted in the same manner as in Example 4. The results are shown in Table 1.

EXAMPLE 6

A polyamic acid was synthesized in the same manner as in Example 4 except that the amounts of 4,4'-diaminobenzanilide and 2,2'-di-trifluoromethyl-4,4'-diaminobiphenyl in Example 4 were changed from 52.3 g (0.230 mol) to 58.84 g (0.259 mol) and from 18.44 g (0.057 mol) to 9.22 g (0.029 mol), respectively, and evaluation was conducted in the same manner as in Example 4. The results are shown in Table 1.

EXAMPLE 7

A reactor equipped with a stirrer and a dry gas inlet pipe was charged with 45.91 g (0.202 mol) of 4,4'-diaminobenzanilide and 757.1 g of dimethylacetamide, and the mixture was stirred at 50° C. into a solution. To this solution were added 22.02 g (0.101 mol) of pyromellitic dianhydride and 32.52 g (0.101 mol) of 3,3',4,4'-benzophenonetetracarboxylic dianhydride to react them at a reaction temperature of 50° C. for 3 hours. After cooling the reaction mixture to 10° C. or lower, 17.22 g (0.086 mol) of 4,4'-diaminodiphenyl ether, 10.68 g (0.049 mol) of pyromellitic dianhydride, 15.78 g (0.049 mol) of 3,3',4,4'-benzophenone-tetracarboxylic dianhydride and 11.02 g (0.024 mol) of tris(methacryloyl)pentaerythritol p-aminobenzoate as an amine for terminal modification were added in the form of powder. The resultant mixture was stirred for 3 hours under cooling with ice water and then for 24 hours at room temperature, thereby synthesizing a polyamic acid.

To 588 parts by weight (100 parts by weight in terms of solid content) of the polyamic acid thus obtained, were added 2 parts by weight of BTTB, 2 parts by weight of N-phenylglycine, 0.5 parts by weight of 1H-tetrazole, and 32 parts by weight of 3 EG-A as a photosensitive auxiliary at room temperature into a solution. The thus-obtained composition was coated on a silicon wafer by a spin coater and dried at 70° C. for 6 minutes on a hot plate to form a film having a thickness of about 15 μm.

This silicon wafer on which the film had been formed was exposed by means of a PLA-501F (manufactured by Canon Inc.) using a step tablet mask manufactured by TOPPAN PRINTING CO., LTD. and then subjected to ultrasonic dip development with a 0.15% aqueous solution of tetramethylammonium hydroxide (TMAH). As a result, a pattern was able to be obtained at portions to which energy of exposure of at least 200 $mJ/cm^2$ (at 436 nm) was applied.

A silicon wafer on which a film had been formed in the same manner as described above was also exposed at energy of exposure of 1,500 mJ/cm by means of the PAL-501F using a resolution-evaluating mask manufactured by TOPPAN PRINTING CO., LTD. and then subjected to the same development as described above. As a result, even a pattern having lines and spaces at intervals of 25 μm was able to be resolved. The unit molecular weight per carboxyl group (unit molecular weight/COOH) of the polyamic acid was 244.6. The results are shown in Table 1.

EXAMPLE 8

A polyamic acid was synthesized in the same manner as in Example 7 except that the amounts of 4,4'-diaminobenzanilide and 4,4'-diaminodiphenyl ether in Example 7 were changed from 45.91 g (0.202 mol) to 39.32 g (0.173 mol) and from 17.22 g (0.086 mol) to 22.95 g (0.114 mol), respectively, and evaluation was conducted in the same manner as in Example 7. The results are shown in Table 1.

EXAMPLE 9

A polyamic acid was synthesized in the same manner as in Example 7 except that the amounts of 4,4'-diaminobenzanilide and 4,4'-diaminodiphenyl ether in Example 7 were changed from 45.91 g (0.202 mol) to 26.14 g (0.115 mol) and from 17.22 g (0.086 mol) to 34.44 g (0.172 mol), respectively, and evaluation was conducted in the same manner as in Example 7. The results are shown in Table 1.

EXAMPLE 10

A reactor equipped with a stirrer and a dry gas inlet pipe was charged with 45.9 g (0.202 mol) of 4,4'-diaminobenzanilide and 811 g of dimethylacetamide, and the mixture was stirred at 50° C. into a solution. To this solution were added 22.9 g (0.105 mol) of pyromellitic dianhydride and 33.8 g (0.105 mol) of 3,3',4,4'-benzophenonetetracarboxylic dianhydride to react them at a reaction temperature of 50° C. for 3 hours. After cooling the reaction mixture to 10° C. or lower, 9.8 g (0.045 mol) of pyromellitic dianhydride, 14.5 g (0.045 mol) of 3,3',4,4'-benzophenone-tetracarboxylic dianhydride, 25.1 g (0.086 mol) of 1,4-bis(4-aminophenoxy)benzene and 11.02 g (0.024 mol) of tris(methacryloyl)pentaerythritol p-aminobenzoate as an amine for terminal modification were added in the form of powder. The resultant mixture was stirred for 3 hours under cooling with ice water and then for 24 hours at room temperature, thereby synthesizing a polyamic acid.

To 597 parts by weight (100 parts by weight in terms of solid content) of the polyamic acid thus obtained, were added 2 parts by weight of BTTB, 2 parts by weight of N-phenylglycine, 0.5 parts by weight of 1Htetrazole, and 32 parts by weight of 3 EG-A as a photosensitive auxiliary at room temperature into a solution. The thus-obtained composition was coated on a silicon wafer by a spin coater and dried at 70° C. for 6 minutes on a hot plate to form a film having a thickness of about 15 μm.

This silicon wafer on which the film had been formed was exposed by means of a PLA-501F (manufactured by Canon Inc.) using a step tablet mask manufactured by TOPPAN PRINTING CO., LTD. and then subjected to ultrasonic dip development with a 0.15% aqueous solution of tetramethylammonium hydroxide (TMAH). As a result, a pattern was able to be obtained at portions to which energy of exposure of at least 200 mJ/cm$^2$ (at 436 nm) was applied.

A silicon wafer on which a film had been formed in the same manner as described above was also exposed at energy of exposure of 1,500 mJ/cm$^2$ by means of the PAL501F using a resolution-evaluating mask manufactured by TOPPAN PRINTING CO., LTD. and then subjected to the same development as described above. As a result, even a pattern having lines and spaces at intervals of 25 μm was able to be resolved. The unit molecular weight per carboxyl group (unit molecular weight/COOH) of the polyamic acid was 258.3. The results are shown in Table 1.

Comparative Example 1

A reactor was charged with 110.5 g (0.264 mol) of 2,2'-di(p-aminophenyl)-6,6'-bisbenzoxazole, 10.1 g (0.022 mol) of tris(methacryloyl)pentaerythritol p-aminobenzoate as an amine for terminal modification, 552 g of dimethylacetamide, and 552 g of N-methyl-2-pyrrolidone to prepare a uniform solution. While stirring the solution and cooling with ice water, 88.6 g (0.276 mol) of 3,3',4,4'-benzophenonetetracarboxylic dianhydride as an acid anhydride were then added little by little in the form of powder. A reaction was conducted for 3 hours under cooling with ice water and subsequently for 20 hours at 30° C., thereby synthesizing a polyamic acid.

To 625 parts by weight (100 parts by weight in terms of solid content) of the polyamic acid thus obtained, were added 2 parts by weight of BTTB, 2 parts by weight of N-phenylglycine, 0.5 parts by weight of 1H-tetrazole, and 32 parts by weight of 3 EG-A as a photosensitive auxiliary at room temperature into a solution. The thus-obtained composition was coated on a silicon wafer by a spin coater and dried at 60° C. for 30 minutes by a drier to form a film having a thickness of about 10 μm.

This silicon wafer on which the film had been formed was exposed by means of a PLA-501F (manufactured by Canon Inc.) using a step tablet mask manufactured by TOPPAN PRINTING CO., LTD. and then subjected to ultrasonic dip development with a 0.15% aqueous solution of tetramethylammonium hydroxide (TMAH).

As a result, no film was dissolved under these conditions. The TMAH concentration of the developer was increased to 2.38% to conduct the same development. However, no film was dissolved. The unit molecular weight per carboxyl group (unit molecular weight/COOH) of the polyamic acid was 370.3. The results are shown in Table 1.

Comparative Example 2

A reactor was charged with 110.5 g (0.264 mol) of 2,2'-di(p-aminophenyl)-6,6'-bisbenzoxazole, 10.1 g (0.022 mol) of tris(methacryloyl)pentaerythritol p-aminobenzoate as an amine for terminal modification, 511.6 g of dimethylacetamide, and 511.6 g of N-methyl-2-pyrrolidone to prepare a uniform solution. While stirring the solution and cooling with ice water, 44.3 g (0.138 mol) of 3,3',4,4'-benzophenonetetracarboxylic dianhydride and 30.0 g (0.138 mol) of pyromellitic dianhydride as acid anhydrides were then added little by little in the form of powder. A reaction was conducted for 3 hours under cooling with ice water and subsequently for 20 hours at 30° C., thereby synthesizing a polyamic acid.

To 625 parts by weight (100 parts by weight in terms of solid content) of the polyamic acid thus obtained, were added 2 parts by weight of BTTB, 2 parts by weight of N-phenylglycine, 0.5 parts by weight of 1H-tetrazole, and 32 parts by weight of 3 EG-A as a photosensitive auxiliary at room temperature into a solution. The thus-obtained composition was coated on a silicon wafer by a spin coater and dried at 60° C. for 30 minutes by a drier to form a film having a thickness of about 10 μm.

This silicon wafer on which the film had been formed was exposed by means of a PLA-501F (manufactured by Canon Inc.) using a step tablet mask manufactured by TOPPAN PRINTING CO., LTD. and then subjected to ultrasonic dip development with a 0.15% aqueous solution of tetramethylammonium hydroxide (TMAH).

As a result, no film was dissolved under these conditions. The TMAH concentration of the developer was increased to 2.38% to conduct the same development. However, no film was dissolved. The unit molecular weight per carboxyl group (unit molecular weight/COOH) of the polyamic acid was 344.4. The results are shown in Table 1.

TABLE 1

| | Structure | | | | Coefficient | |
|---|---|---|---|---|---|---|
| | Tetracarboxylic dianhydride (molar ratio) | Diamine compound (molar ratio) | Unit molecular weight/COOH | Residual stress (MPa) | of thermal expansion (ppm) | Patterning ability |
| Ex. 1 | P (100) | DABA | 222.7 | 5.1 | 2.5 | Δ |
| Ex. 2 | P/B (80:20) | DABA | 233.1 | 9.0 | 4.3 | ○ |
| Ex. 3 | P/B (50:50) | DABA | 248.9 | 15.1 | 8.8 | ○ |
| Ex. 4 | P/B (80/20) | DABA/6FDAB (80:20) | 242.4 | 9.6 | 5.2 | ○ |
| Ex. 5 | P/B (80:20) | DABA/6FDAB (85:15) | 240.0 | 10.7 | 6.0 | ◎ |
| Ex. 6 | P/B (80:20) | DABA/6FDAB (90:10) | 237.8 | 9.6 | 5.1 | ○ |
| Ex. 7 | P/B (50:50) | DABA/ODA (70:30) | 244.6 | 25.3 | 16.3 | ○ |
| Ex. 8 | P/B (50:50) | DABA/ODA (60:40) | 243.3 | 30.9 | 21.1 | ○ |
| Ex. 9 | P/B (50:50) | DABA/ODA (40:60) | 240.6 | 36.5 | 28.2 | Δ |
| Ex. 10 | P/B (50:50) | DABA/TPE (70:30) | 258.3 | 24.5 | 17.5 | ○ |

TABLE 1-continued

| | Structure | | | | Coefficient | |
|---|---|---|---|---|---|---|
| | Tetracarboxylic dianhydride (molar ratio) | Diamine compound (molar ratio) | Unit molecular weight/COOH | Residual stress (MPa) | of thermal expansion (ppm) | Patterning ability |
| Comp. Ex. 1 | B (100) | NPN | 370.3 | 33.0 | 17.0 | × |
| Comp. Ex. 2 | P/B (50:50) | NPN | 344.4 | 19.0 | 12.0 | × |

(Note)
(1) Description of characters of the monomers:
P: pyromellitic dianhydride;
B: 3,3',4,4'-benzophenonetetracarboxylic dianhydride;
DABA: 4,4'-diaminobenzanilide;
6FDAB: 2,2'-di-trifluoromethyl-4,4'-diaminobiphenyl;
ODA; 4,4'-diaminophenyl ether;
TPE: 1,4-bis(4-aminophenoxy)benzene;
NPN: 2,2'-di(p-aminophenyl)-6,6'-bisbenzoxazole.
(2) Description of patterning ability:
◎: A pattern having lines and spaces at intervals of 20 μm can be clearly formed;
○: A pattern having lines and spaces at intervals of about 25 μm can be clearly formed;
Δ: A pattern having lines and spaces at intervals of 30 μm can be formed. The shoulder of the pattern partially becomes round;
×: Even a pattern having lines and spaces at intervals of 30 μm cannot be formed.
(3) Measuring method of residual stress:
Each of the compositions was coated on a silicon wafer (crystal orientation: 100) having a thickness of 500 μm by a spin coater and dried at 70° C. for 4 minutes on a hot plate to form a film having a thickness of about 10 μm. This silicon wafer on which the film had been formed was wholly exposed at energy of exposure of 1,000 mJ/$cm^2$ by means of the PLA-501F. Thereafter, the film was subjected to a heat treatment at 400° C. for 2 hours in a nitrogen atmosphere to conduct imidation. After the imidation, the warpage occurred on the silicon wafer was measured by means of a tracer type surface-configuration-measuring device P-10 (manufactured by Tencall Co.). On the basis of its measurement value and the thickness of the film after the imidation, a calculation was made in accordance with a calculation program for residual stress stored in P-10, thereby obtaining a residual stress value of the film.
(4) Measurement of coefficient of thermal expansion:
A polymide film was formed in accordance with the same process as in the measurement of the residual stress. The film was treated with 50% hydrofluoric acid and separated from the silicon wafer. After the film was thoroughly washed with water, it was dried at 120° C. for 30 minutes.
The coefficient of thermal expansion of this film was measured by means of a TMA120 model manufactured by Seiko Instruments Inc. under the following conditions:
① Form of specimen: width = 4 mm, length = 25 mm, measuring length = 10 mm;
② Measuring mode: tensile load = 2 g;
③ Measuring temperature: one cycle = room temperature → 350° C. → 20° C. → 200° C. → −20° C.
A change in the average coefficient of thermal expansion of the polyimide film between 200° C. and −20° C. in the second cycle was shown;
④ Heating rate: 5° C./min;
⑤ Measuring atmosphere: in nitrogen gas.
(5) On selection of substrate:
In recent years, various metallic materials have been used for substrates. SUS304, a copper substrate obtained by forming a copper film on a silicon wafer by sputtering, and a substrate obtained by forming a polyimide film on a silicon substrate were used as substrates in place of a silicon wafer to evaluate the photosensitive resin compositions prepared above as to the patterning ability in the same manner as described above. As a result, when the photosensitive resin compositions according to Examples 1 to 10 were used, patterns were able to be formed on all the substrates without any problem.

What is claimed is:

1. A photosensitive polyimide resin composition comprising:

(A) a polyamic acid having, in its main chain, repeating units formed from a polycondensation product of at least one tetracarboxylic acid or anhydride thereof with at least one diamine compound, and represented by a formula (1):

(1)

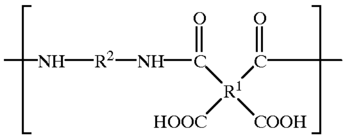

wherein $R^1$ is a tetravalent organic group, and $R^2$ is a bivalent organic group, and having actinic ray-sensitive functional groups at both terminals thereof;

(B) a photosensitive auxiliary having a photopolymerizable functional group;

(C) a photopolymerization initiator; and (D) a solvent, wherein ① the polyamic acid is such that when the repeating unit represented by the formula (1) is defined as a unit molecular weight, a unit molecular weight per carboxyl group (unit molecular weight/COOH) falls within a range of from 200 to 300, and ② the photosensitive resin composition permits the formation of a polyimide film having a residual stress of 40 MPa or lower and a coefficient of thermal expansion of 30 ppm/° C. or lower on a substrate.

2. The photosensitive polyimide resin composition according to claim 1, wherein the actinic ray-sensitive functional group is a group $Z^1$ represented by a formula (2):

(2)

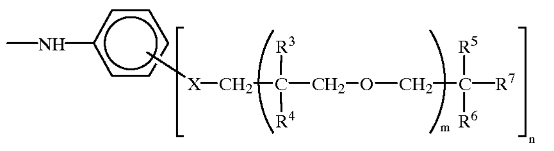

wherein X is a single bond, —O—, —CO—, —COO—, —OCO—, —OCOO—, —$COCH_2O$—, —S—, —SO—, —$SO_2$— or —$SO_2O$—, $R^3$, $R^4$, $R^5$, $R^6$ and $R^7$ are independently a substituent group having a photopolymerizable carbon—carbon double bond, m is 0 or 1, and n is an integer within a range of from 1 to 3, and the polyamic acid is a polyamic acid (A1) represented by a formula (3):

(3)

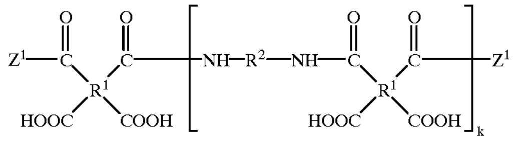

wherein $R^1$ is a tetravalent organic group, $R^2$ is a bivalent organic group, k is an integer within a range of from 5 to 10,000, and $Z^1$ is the actinic ray-sensitive functional group represented by the formula (2).

3. The photosensitive polyimide resin composition according to claim 1, wherein the actinic ray-sensitive functional group is a group $Z^2$ represented by the formula (4):

(4)

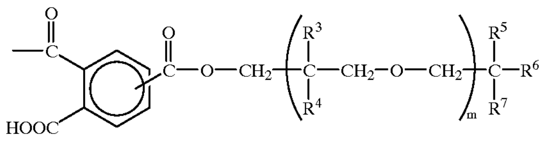

wherein $R^3$, $R^4$, $R^5$, $R^6$ and $R^7$ are independently a substituent group having a photopolymerizable carbon—carbon double bond, and m is 0 or 1, and the polyamic acid is a polyamic acid (A2) represented by a formula (5):

(5)

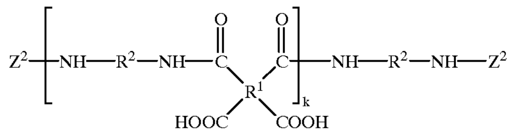

wherein $R^1$ is a tetravalent organic group, $R^2$ is a bivalent organic group, k is an integer within a range of from 5 to 10,000, and $Z^2$ is the actinic ray-sensitive functional group represented by the formula (4).

4. The photosensitive polyimide resin composition according to claim 1, wherein (A) the polyamic acid is a polyamic acid having, in its main chain, repeating units formed from a polycondensation product of tetracarboxylic acid(s) or dianhydride(s) thereof, which consist of 30 to 100 mol % of pyromellitic dianhydride and 0 to 70 mol % of 3,3',4,4'-benzophenonetetracarboxylic dianhydride, with a diamine compound consisting of 4,4'-diaminobenzanilide.

5. The photosensitive polyimide resin composition according to claim 1, wherein (A) the polyamic acid is a polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonetetracarboxylic dianhydride, with diamine compounds consisting of 30 to 99 mol % of 4,4'-diaminobenzanilide and 1 to 70 mol % of 2,2'-di-trifluoromethyl-4,4'-diaminobiphenyl.

6. The photosensitive polyimide resin composition according to claim 1, wherein (A) the polyamic acid is a polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonetetracarboxylic dianhydride, with diamine compounds consisting of 30 to 99 mol % of 4,4'-diaminobenzanilide and 1 to 70 mol % of 4,4'-diaminophenyl ether.

7. The photosensitive polyimide resin composition according to claim 1, wherein (A) the polyamic acid is a polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonetetracarboxylic dianhydride, with diamine compounds consisting of 30 to 99 mol % of 4,4'-diaminobenzanilide and 1 to 70 mol % of 1,4-bis(4-aminophenoxy)benzene.

8. The photosensitive polyimide resin composition according to claim 1, wherein the photosensitive resin composition comprises, per 100 parts by weight of (A) the polyamic acid, 10 to 50 parts by weight of (B) the photosensitive auxiliary having a photopolymerizable functional group, 0.01 to 10 parts by weight of (C) the photopolymerization initiator, and (D) the solvent in an amount sufficient to uniformly dissolve the individual components.

9. The photosensitive polyimide resin composition according to claim 1, wherein the composition further comprises at least one of 1H-tetrazoles.

10. A polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonetetracarboxylic dianhydride, with diamine compounds consisting of 30 to 99 mol % of 4,4'-diaminobenzanilide and 1 to 70 mol % of 2,2'-di-trifluoromethyl-4,4'-diaminobiphenyl.

11. The polyamic acid according to claim 10, wherein the total number of the respective repeating units falls within a range of from 5 to 10,000.

12. The polyamic acid according to claim 10, which has, at both terminals thereof, actinic ray-sensitive functional groups $Z^1$ represented by a formula (2):

(2)

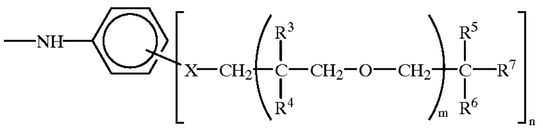

wherein X is a single bond, —O—, —CO—, —COO—, —OCO—, —OCOO—, —$COCH_2O$—, —S—, —SO—, —$SO_2$— or —$SO_2O$—, $R^3$, $R^4$, $R^5$, $R^6$ and R7 are independently a substituent group having a photopolymerizable carbon—carbon double bond, m is 0 or 1, and n is an integer within a range of from 1 to 3.

13. The polyamic acid according to claim 10, which has, at both terminals thereof, actinic ray-sensitive functional groups $Z^2$ represented by the formula (4):

(4)

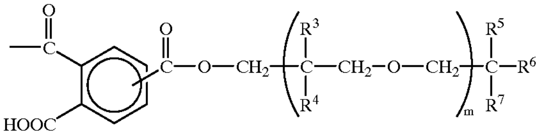

wherein $R^3$, $R^4$, $R^5$, $R^6$ and $R^7$ are independently a substituent group having a photopolymerizable carbon—carbon double bond, and m is 0 or 1.

14. A polyamic acid having, in its main chain, repeating units formed from a polycondensation product of tetracarboxylic acid(s) or tetracarboxylic dianhydride(s) thereof, which consist of 30 to 100 mol % of pyromellitic dianhydride and 0 to 70 mol % of 3,3',4,4'-benzophenonetetracarboxylic dianhydride, with diamine compounds consisting of 30 to 99 mol % of 4,4'-diaminobenzanilide and 1 to 70 mol % of 1,4-bis(4-aminophenoxy)-benzene.

15. The polyamic acid according to claim 14, wherein the total number of the respective repeating units falls within a range of from 5 to 10,000.

16. The polyamic acid according to claim 14, which has, at both terminals thereof, actinic ray-sensitive functional groups $Z^1$ represented by a formula (2):

(2)

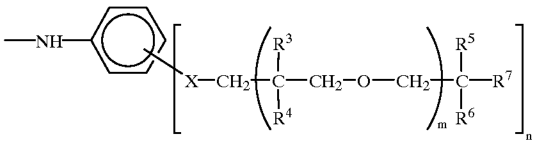

wherein X is a single bond, —O—, —CO—, —COO—, —OCO—, —OCOO—, —$COCH_2O$—, —S—, —SO—, —$SO_2$— or —$SO_2O$—, $R^3$, $R^4$, $R^5$, $R^6$ and $R^7$ are independently a substituent group having a photopolymerizable carbon—carbon double bond, m is 0 or 1, and n is an integer within a range of from 1 to 3.

17. The polyamic acid according to claim 14, which has, at both terminals thereof, actinic ray-sensitive functional groups $Z^2$ represented by the formula (4):

(4)

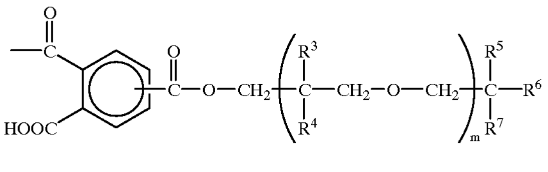

wherein $R^3$, $R^4$, $R^5$, $R^6$ and $R^7$ are independently a substituent group having a photopolymerizable carbon—carbon double bond, and m is 0 or 1.

18. A pattern forming process, comprising the steps of coating a substrate with the photosensitive polyimide resin composition according to claim 1 to form a film, subjecting the film to patterning exposure, and then developing the thus-exposed film with an alkaline developer or alkaline aqueous solution.

19. A polyimide film obtained by coating a substrate with a photosensitive resin composition comprising:

(A) a polyamic acid having, in its main chain, repeating units formed from a polycondensation product of at least one tetracarboxylic acid or tetracarboxylic anhydride thereof with at least one diamine compound, and represented by a formula (1):

(1)

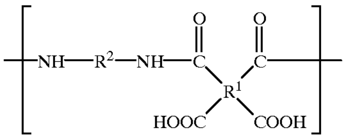

$R^1$ is a tetravalent organic group, and $R^2$ is a bivalent organic group, wherein the polyamic acid is such that when the repeating unit represented by the formula (1) is defined as a unit molecular weight, a unit molecular weight per carboxyl group (unit molecular weight/COOH) falls within a range of from 200 to 300, and actinic ray-sensitive functional groups are introduced at both terminals thereof;

(B) a photosensitive auxiliary having a photopolymerizable functional group;

(C) a photopolymerization initiator; and (D) a solvent, drying the composition to form a film, subjecting the film to exposure, and then heat-treating the thus-exposed film, wherein the polyimide film on the substrate has a residual stress of 40 MPa or lower and a coefficient of thermal expansion of 30 ppm/° C. or lower.

20. The polyimide film according to claim 19, wherein the photosensitve resin composition further compsises at least one of 1H-tetrazoles.

* * * * *

UNITED STATES PATENT AND TRADEMARK OFFICE

CERTIFICATE OF CORRECTION

PATENT NO. : 6,160,081
DATED : December 12, 2000
INVENTOR(S) : Akira Tanaka et al It is certified that error appears in the above-identified patent and that said Letters Patent is hereby corrected as shown below:

Claim 19, column 36, line 39, after the formula and before "$R^1$", insert --wherein--.

Claim 20, column 36, line 56, change "photosensitve" to --photosensitive--.

Signed and Sealed this

Twenty-ninth Day of May, 2001

Attest:

NICHOLAS P. GODICI

Attesting Officer

*Acting Director of the United States Patent and Trademark Office*